United States Patent
Kobayashi et al.

(10) Patent No.: US 7,521,757 B2
(45) Date of Patent: Apr. 21, 2009

(54) SEMICONDUCTOR DEVICE WITH BACK SURFACE ELECTRODE INCLUDING A STRESS RELAXATION FILM

(75) Inventors: Takashi Kobayashi, Nagano (JP); Koji Sasaki, Nagano (JP); Yasuharu Mikoshiba, Nagano (JP); Masahiro Kato, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 120 days.

(21) Appl. No.: 11/812,810

(22) Filed: Jun. 21, 2007

(65) Prior Publication Data

US 2008/0006856 A1 Jan. 10, 2008

(30) Foreign Application Priority Data

Jun. 22, 2006 (JP) ............................. 2006-172426

(51) Int. Cl.
H01L 29/76 (2006.01)
H01L 29/94 (2006.01)
H01L 31/00 (2006.01)

(52) U.S. Cl. ...................... 257/335; 257/337; 257/370; 257/E27.015

(58) Field of Classification Search ................. 257/335, 257/337, 370, E27.015
See application file for complete search history.

(56) References Cited

U.S. PATENT DOCUMENTS

| | | | | |
|---|---|---|---|---|
| RE33,693 E | * | 9/1991 | Bean et al. ..................... 257/19 |
| 5,242,862 A | * | 9/1993 | Okabe et al. ................. 438/268 |
| 7,145,254 B2 | | 12/2006 | Hirano et al. | |
| 2005/0170555 A1 | | 8/2005 | Hirano et al. | |
| 2005/0227438 A1 | * | 10/2005 | Okabe et al. ................. 438/268 |
| 2006/0183339 A1 | * | 8/2006 | Ravi et al. ................... 438/758 |
| 2007/0187716 A1 | * | 8/2007 | Chu ........................... 257/192 |
| 2008/0048257 A1 | * | 2/2008 | de Fresart et al. ............ 257/341 |
| 2008/0237709 A1 | * | 10/2008 | Chidambarrao et al. ..... 257/347 |

FOREIGN PATENT DOCUMENTS

| | | |
|---|---|---|
| JP | 2001-135814 | 5/2001 |
| JP | 2003-282589 | 10/2003 |
| JP | 2004-103919 | 4/2004 |
| JP | 2005-244165 | 9/2005 |

* cited by examiner

*Primary Examiner*—Ngan Ngo
(74) *Attorney, Agent, or Firm*—Rabin & Berdo, PC (57) ABSTRACT

A semiconductor device includes a semiconductor substrate which has first and second principal surface regions; an insulated gate structure which is formed in the first principal surface region; a back surface region semiconductor layer which is formed in the second principal surface region and has a thickness of at most 5 μm; an outermost metal film; and a back surface electrode which is formed in the second principal surface region between the back surface region semiconductor layer and the outermost metal film and which is composed of a plurality of films which are laminated and include a stress relaxation film so that false judgment of chip quality based on leakage current measurements during manufacturing is reduced particularly when dust is present and skews leakage current measurements due to strain on the wafer and the piezoelectric effect produced.

20 Claims, 9 Drawing Sheets

SEMICONDUCTOR DEVICE WITH BACK SURFACE ELECTRODE INCLUDING A STRESS RELAXATION FILM

CROSS-REFERENCE TO RELATED APPLICATION

This Application is based on and claims the priority of Japanese Patent Application No. 2006-172426 filed Jun. 22, 2006, the contents of which are incorporated herein by reference.

BACKGROUND OF THE INVENTION

1. Field of the Invention

The present invention relates to a semiconductor device, such as an IGBT (insulated gate bipolar transistor), a MOSFET, a diode, or the like, that has a thin back surface region diffusion layer and a back surface electrode on the back surface side of a semiconductor substrate.

2. Description of the Related Art

IGBTs are voltage driven devices exhibiting a low ON voltage and a high switching speed. IGBTs have been utilized in diverse applications ranging from industrial inverters to household appliances such as microwave ovens. There are several types of structures in IGBTs including a PT (punch through) type, a NPT (non-punch through) type, and an FS (field stop) type. In the following description, "n" represents an n conductivity type and "p" represents a p conductivity type. A PT-IGBT (punch through insulated gate bipolar transistor) is formed using an epitaxial wafer, in which an n buffer layer and an n drift layer are epitaxially grown on a p semiconductor substrate. As a result, a wafer of such a device having a withstand voltage of 600 V has a thickness, for example, which ranges from about 200 to about 300 μm.

Figure 5:
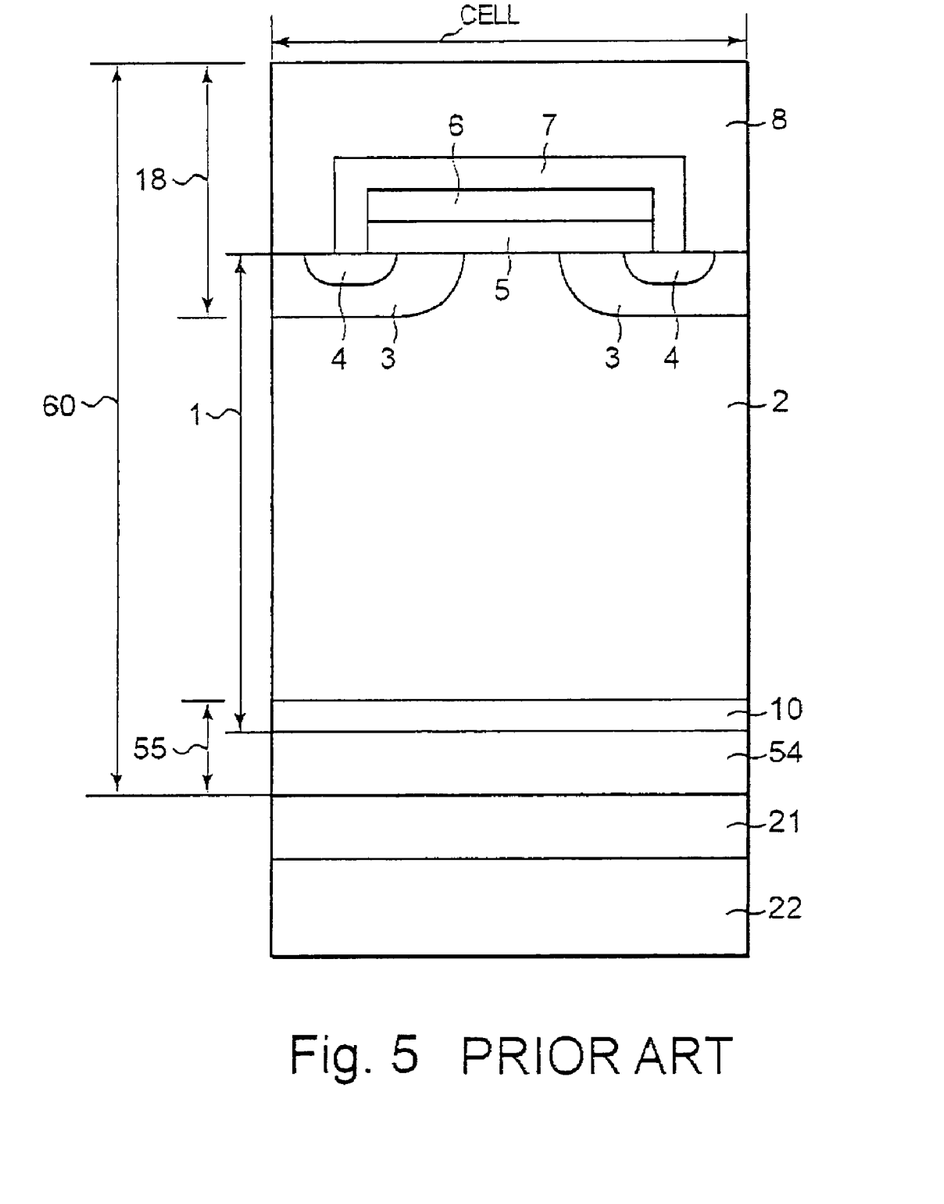
FIG. 5 is a sectional view of an essential part of a prior art NPT-IGBT.

FIG. 5 is a sectional view of an essential part of an NPT-IGBT (non-punch through type insulated gate bipolar transistor). FIG. 5 is a sectional view of one cell in an NPT-IGBT chip, the latter including a multiple of cells.

As shown in FIG. 5, a p base region 3 is selectively formed in the front surface side of an n drift layer 2, which is an n semiconductor substrate 1 composed of an FZ wafer, for example, and not a diffusion layer. An n emitter region 4 is selectively formed in the front surface side of the p base region 3. A gate electrode 6 is formed on the front surface of the substrate and stretches from one n emitter region 4 in one p base region 3 to another n emitter region 4 in another p base region 3 which is separate from the former p base region 3, as shown in FIG. 5, with interposing of a gate insulator film 5 under the gate electrode 6.

Emitter electrode 8 is in contact with both the n emitter regions 4 and the p base regions 3, and insulated from the gate electrode 6 by an interlayer insulator film 7. On the back surface of the substrate 1, a p collector layer 10 and a back surface electrode 54 are formed in which the latter is a collector electrode. The p collector layer 10 and the back surface electrode 54 make up a back surface region structure 55. The reference numeral 18 in FIG. 5 designates a front surface region structure, the numeral 21, a solder, the numeral 22, a support conductor, and the numeral 60, a chip after cutting the wafer. The thickness of the n drift layer 2 of an NPT-type IGBT is greater than that of a PT-type IGBT. On the other hand, the p collector layer 10 in the NPT-type IGBT, when formed by ion implantation from the back surface side, can be made significantly thinner than the p collector layer 10 in a PT-type IGBT, which employs a high density p semiconductor substrate for a p collector layer. Therefore, wafer thickness can be remarkably reduced as compared with a PT-type IGBT device.

Recently, in order to reduce the ON voltage and the switching loss, FS-IGBTs (field stop type insulated gate bipolar transistors) have been developed that have an n semiconductor substrate with a reduced thickness and a back surface region diffusion layer (a field stop layer and a p collector layer) with a reduced thickness.

Figure 6:
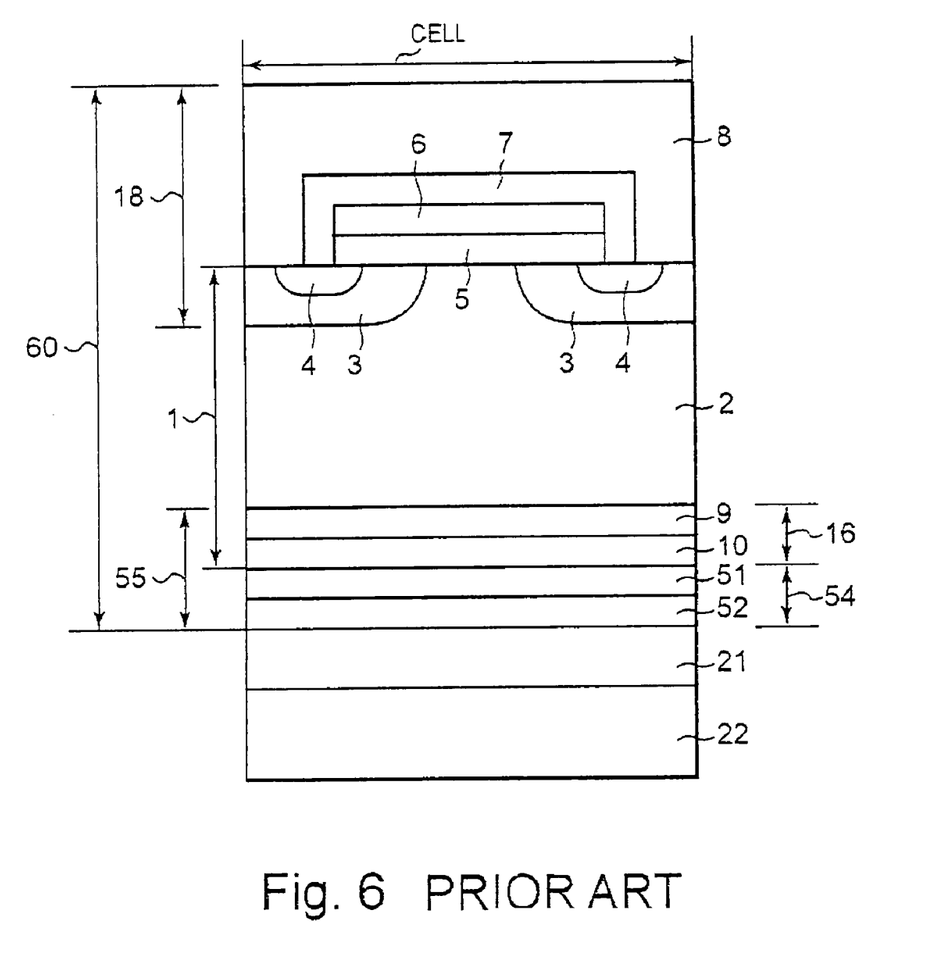
FIG. 6 is a sectional view of an essential part of a prior art FS-IGBT.

FIG. 6 is a sectional view of an essential part of an FS-IGBT. FIG. 6 is a sectional view of one cell in an FS-IGBT chip, the latter including a multiple of cells therein. As shown in FIG. 6, the device structure in the front substrate surface side (a front surface region structure 18) is the same as the front surface region structure 18 in the NPT-type device shown in FIG. 5. In the back surface region of the substrate, a buffer layer 9 (which is called a "field stop layer 9" in an FS-IGBT) is provided between the n drift layer 2 and the p collector layer 10. In the FS-type device, since the n semiconductor substrate 1 can be made very thin, the wafer thickness is remarkably reduced as compared with a PT-type device. Furthermore, the thickness of a wafer in the FS-type device, which includes a field stop layer 9, can be reduced as compared to that of a NPT-type device.

In this FS-IGBT, the thickness of the n semiconductor substrate 1 ranges from approximately 80 μm to 100 μm in a class of devices having a withstand voltage of 600 V, from approximately 100 μm to 140 μm in a class of devices having a withstand voltage of 1,200 V. The thickness of the filed stop layer 9, which stops the spread of a depletion layer, is about 1 μm. A p collector layer 10 with a thickness of about 1 μm is formed in contact with this field stop layer 9, forming a back surface region diffusion layer 16. On the surface of this collector layer 10, a back surface electrode 54, which becomes a collector electrode, is formed. The back surface electrode 54 is formed by laminating a plurality of metal films 51, 52.

The back surface electrode 54 consists of a titanium film 51 and a nickel film 52, in the order from the side in contact with the p collector layer 10, and joined to a support conductor 22 (such as a metal base) with a solder 21. Reference numeral 55 in FIG. 6 designates a back surface region structure, and reference numeral 60 designates a chip after cutting.

The front surface region structure 18 in FIG. 5 and FIG. 6 consists of p base region 3, n emitter region 4, gate insulator film 5, gate electrode 6, interlayer insulator film 7, emitter electrode 8, and a protective film (not shown in the figures). The back surface region structure 55 consists of the back surface region diffusion layer 16 and the back surface electrode 54.

Figure 7A:
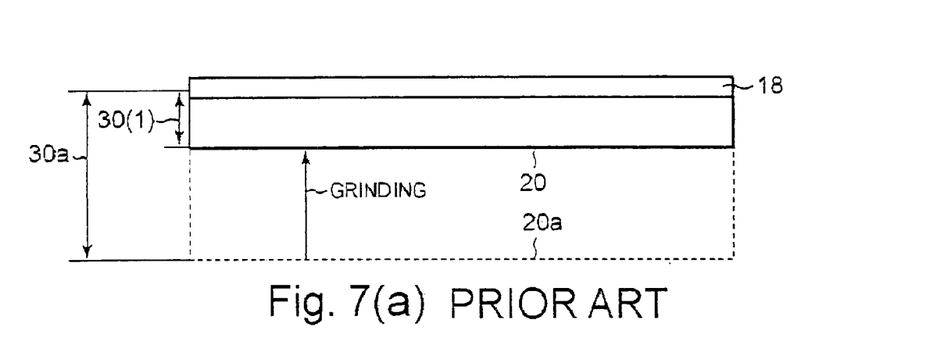
FIG. 7(a) through 7(c) shows a prior art method of manufacturing the FS-IGBT of FIG. 6 and are sectional views illustrating an essential part in the manufacturing process in the sequence of steps in the process.
Figure 7B:
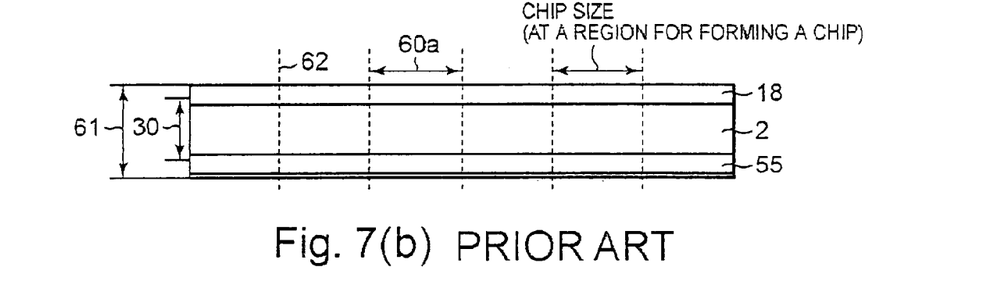
Figure 7C:
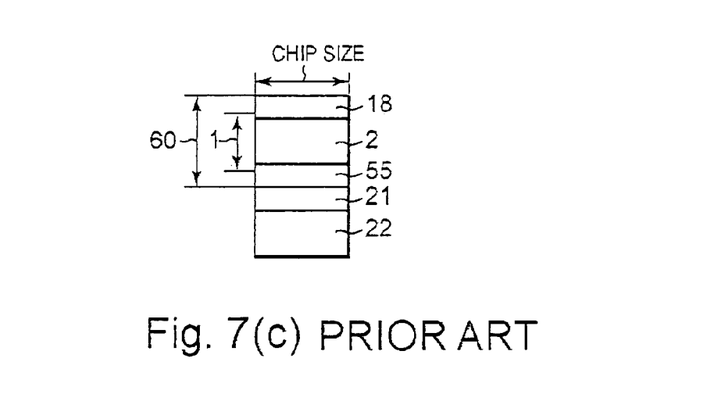

FIGS. 7(a) through 7(c) illustrate a method of manufacturing the FS-IGBT of FIG. 6. FIGS. 7(a) through 7(c) are sectional views showing steps to manufacture essential parts in the order of the manufacturing steps. The reference numeral 18 designates the front surfaced region structure 18 and the reference numeral 55 designates the back surface region structure, details of the structures thereof being omitted in the figures for simplicity and clarity.

Referring to FIG. 7(a), a front surface region structure 18 is formed in the first principal surface region of wafer 30a. The back surface 20a is ground away to thin the wafer 30a down to a thickness of 140 μm. The reference numeral 30 in FIG. 7(a) designates the wafer that has been thinned by grinding which is being worked into n semiconductor substrate 1.

Referring to FIG. 7(b), a titanium film 51, a nickel film 52 and a gold film are laminated on the p collector layer 10 (which are not shown individually in FIG. 7(b), but are shown as back surface region structure 55) on the back surface 20 of the wafer 30. A region surrounded by scribe lines 62 of the wafer 61, on which the front surface region structure 18 and the back surface region structure 55 are formed, becomes a chip 60 in region 60a for forming the chip 60.

Referring to FIG. 7(c), after forming a chip 60 having a chip size 60 as exemplified, by cutting the wafer 61 along the scribe lines 62, the gold film on the back surface of the chip 60 is joined to a support conductor 22 (a copper base, for example) with a solder 21. This gold film, after joining, is absorbed in the solder 21 and disappears.

The FS-IGBT of FIG. 6 formed in the process as described above, is subjected to measurements of gate characteristics and withstand voltage characteristics during the stage of wafer 61 shown in FIG. 7(b). The measurements made in this stage are intended to find defective chips in this early stage and transfer only good chips to for further processing steps to reduce manufacturing costs.

Figure 8:
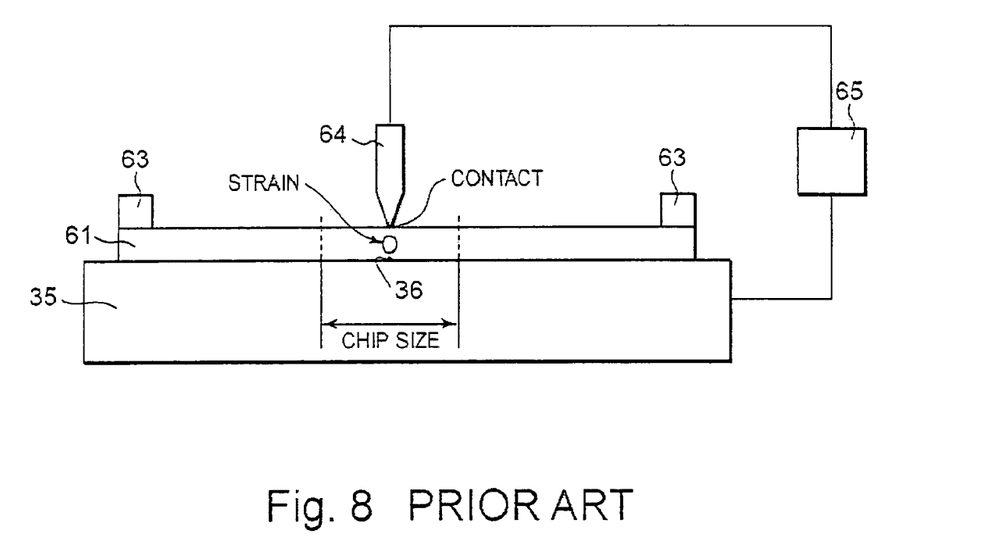
FIG. 8 shows a prior art arrangement for measuring the withstand voltage characteristic in a wafer stage.

FIG. 8 shows an arrangement for measuring the withstand voltage characteristics in the wafer stage. The wafer 61 is positioned on a stage 35 and held by pressing the periphery of the wafer 61 with metal fittings 63. A probe 64 is pushed against the surface of the wafer 61. A voltage is applied between collector and emitter of the region 60a for forming a chip 60 in which an FS-IGBT is formed, to measure leakage current using a curve tracer (plotter) 65. The applied voltage is set at a voltage to make a depletion layer reach the n field stop layer 9.

During the measurement, if any dust 36 is present on stage 35 shown in FIG. 8, the wafer 61 is placed on the dust 36 and, when the wafer is contacted and pushed by probe 64, the wafer 61 warps. When the dust has a particle size which is large enough to badly warp the wafer 61, a crack may result and the chip 60a may be rendered defective. When the dust 36 has a smaller particle size, the n field stop layer 9 in the area placed on the dust 36 distorts from the pressure exerted by the metal fitting 63 generating strain shown generally in area "O". Then, when the depletion layer reaches the n field stop layer 9, the leakage current increases abruptly due to the piezoelectric effect, and the chip is falsely judged to be defective. In this case, however, if the measurement is repeated after removing dust 36 to thus eliminate the strain, the chip tests as a good chip. A major type of dust 36 encountered consists of fragments of silicon particles broken from the periphery of the wafer during the manufacturing process. In the case a thick n field stop layer 9, however, an increase of leakage current due to the piezoelectric effect does not occur.

Figure 9:
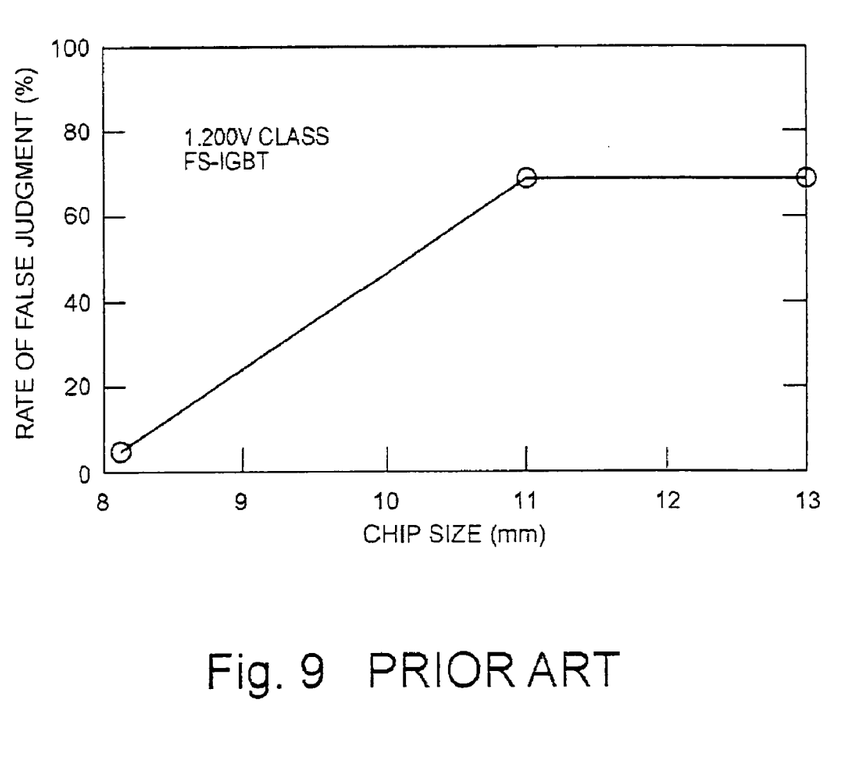
FIG. 9 shows the prior art correlation between the rate of false judgment of leakage current and the chip size.

FIG. 9 shows the correlation between the rate of false judgment of leakage current and the chip size. The leakage current is measured for each chip 60a in the state of a wafer 61 as shown in FIG. 8. The chip size is the size of the region 60a for forming a chip as indicated in FIG. 7b. As can be seen from FIG. 9, the rate of false judgment rapidly increases above a chip size of 8 mm square, and becomes more than 60% at 11 mm square.

A rate of false judgment in leakage current measurement of chips is defined by the expression:

$$(A-B)/A \times 100 (\%)$$

wherein A is the number of defective chips determined by leakage current in the measurement on a wafer 61, and B is the number of defective chips determined by leakage current measured on the chips cut out from the places of the chips that have been judged as defective. Initially, an address number is given to every region 60a for forming a chip in the stage of a wafer 61 shown in FIG. 7b. Leakage current is measured at every region 60a for forming a chip in the state of a wafer 61 to obtain the number of defective chips A. After dividing into chips, the leakage current is measured on the chips with the address number judged as defective, to obtain the number of defective chips B. By giving the address number to the regions 60a for forming a chip, it becomes possible to obtain the number of chips that have turned out to be good after being divided into chips from the regions 60a for forming a chip which were initially classified to be defective in the stage of a wafer 61. Here, such chips are excluded in the count of chips that have turned out defective in the leakage current measurement due to clacking or breaking during the process of dividing into chips. In the leakage. current measurement performed on each chip 60, the stage 35 is placed in a dust-free state by thorough cleaning prior to contact with the chip 60. Since the stage 35 on which a chip 60 is placed has a size which is approximately the same as that of the chip 60, and is smaller than one part in several tens of the size of the stage 35 on which a wafer 61 is placed, dust 36 can be thoroughly eliminated.

Japanese Unexamined Patent Application Publication No. 2004-103919 discloses a semiconductor wafer having semiconductor devices formed in the first principal surface region (front side) of the wafer and an electrode film on the second principal surface (back side) of the semiconductor wafer, in which a metal layer is formed on the second principal surface side interposing a titanium layer there between. This structure is stated to give a semiconductor wafer that is thin as finished and hardly warped.

Japanese Unexamined Patent Application Publication No. 2003-282589 discloses a process for making a wafer in which an impurity diffusion region for forming a semiconductor device in the surface region of one side of the wafer is provided, which is ground down to a predetermined thickness from the other side of the wafer; the wafer is etched to thin down to a predetermined thickness excepting the peripheral region; an impurity-doped polysilicon film is formed on this etched surface, from which impurities are diffused to form an impurity diffusion region for a contact; and a back surface electrode is formed in contact with the polysilicon film. This document asserts that this structure avoids the strength issue typical in a thin wafer and attains a contact on the back surface electrode at a relatively low temperature. This back surface electrode consists of a titanium film, a nickel film, and a gold film in this sequence from the polysilicon film in the state of a wafer.

Japanese Unexamined Patent Application Publication No. 2001-135814 discloses a vertical type MOSFET having a Schottky junction on the back surface side, in which the Schottky junction is formed using an Al—Si alloy with a thickness of 1,500 Å and a silicon content of at least 0.5 wt %. This document asserts that this structure achieves lower losses and costs.

Japanese Unexamined Patent Application Publication No. 2005-244165 discloses a wafer prepared for making semiconductor chips in which the principal front surface and the principal back surface of the wafer are in conformity with the principal front surface and the principal back surface of the semiconductor chips, respectively, and a back surface electrode is formed on the principal back surface of the semiconductor wafer. In the condition when the back surface electrode is fixed on a support conductor, after forming a front surface electrode on the principal front surface of the semiconductor wafer, the support conductor is removed and the semiconductor wafer is cut to form semiconductor chips. This document asserts that the distortion of the semiconductor wafer for making semiconductor chips is suppressed and is minimal. The back surface electrode consists of three layers, i.e., a titanium film, a nickel film, and a gold film in this sequence from the semiconductor side.

As described above with reference to FIGS. 6 through 9, when the back surface region diffusion layer 16 is thin and dust 36 is present on the stage 35 for measuring the characteristics, the region 60a for forming a chip in the wafer 61 suffers from cracking or from false judgment of leakage current thereby lowering the proportion of good chips deemed obtained. Moreover, when the particle size of dust 36 is about 10 μm or less, the proportion of false judgment of leakage current due to piezoelectric effect increases in the region 60a for forming a chip.

The four Japanese Unexamined Patent Applications discussed in the foregoing, however, do not mention the false judgment of leakage current at the region for forming a chip in the stage of a wafer, which is a problem when the back surface region diffusion layer is thin.

It is therefore an object of the present invention to solve the above problem and provide a semiconductor device in which the false judgment of leakage current due to piezoelectric effect at the region for forming a chip in the state of a wafer scarcely occurs even when dust is present on the stage for measuring the device characteristics.

SUMMARY OF THE INVENTION

This and other objects of the invention are achieved by providing a semiconductor device, comprising a semiconductor substrate having first and second principal surface regions; an insulated gate structure which is formed in the first principal surface region; a back surface region semiconductor layer which is formed in the second principal surface region and has a thickness of at most 5 μm; an outermost metal film; and a back surface electrode which is formed in the second principal surface region between the back surface region semiconductor layer and the outermost metal film and which is composed of a plurality of films which are laminated and which include a stress relaxation film.

The back surface region semiconductor layer is preferably one of a back surface region diffusion layer or a back surface region epitaxial layer.

The stress relaxation film is preferably a conductive film exhibiting a ductility which is large.

The conductive film is preferably an Al—Si (aluminum-silicon) film containing silicon in an amount of at most 2 wt %.

The plurality of films which compose the back surface electrode include one of (a) an Al—Si film, a metal barrier film, and a nickel film, or (b) a titanium film, an Al—Si film, a metal barrier film, and a nickel film and are sequentially formed in this order from the back surface region semiconductor layer towards the outermost metal film. The metal barrier film can be selected from a titanium film, a molybdenum film, and a tungsten film. When the conductivity type of the back surface region semiconductor layer in contact with the Al—Si film is p type, an impurity concentration of the semiconductor layer can be a low value of 1015 cm-3. However, when the conductivity type of the back surface region semiconductor layer in contact with the Al—Si film is n type, the impurity concentration must be at least 1019 cm-3. When a titanium film is in contact with the back surface region semiconductor layer, an impurity concentration of 1019 cm-3 can attain an ohmic contact regardless of the conductivity type of the back. surface region semiconductor layer.

The back surface region semiconductor layer is composed of a field stop layer and a collector layer that is formed in contact with the field stop layer in the case of an FS-IGBT; the back surface region semiconductor layer is a cathode layer in the case of a diode; and the back surface region semiconductor layer is a drain layer in the case of a MOSFET.

For a semiconductor device operated in the condition wherein a depletion layer extending in the semiconductor substrate reaches the back surface region semiconductor layer at a rated voltage applied between the first principal surface and the second principal surface, it is possible according to the construction of the invention as described above that the increase of leakage current due to piezoelectric effect caused by dust is suppressed even when the back surface region semiconductor layer is thin.

According to the invention, a stress relaxation layer of Al—Si film containing silicon in an amount of at most 2 wt % and exhibiting ductility is interposed between titanium and nickel which collectively compose the back surface electrode. The stress relaxation layer absorbs the stress caused by the dust. Therefore, false judgment of leakage current due to the piezoelectric effect scarcely occurs.

By virtue of the interposed Al—Si film, cracking or breaking of the wafer due to dust present on testing stage are avoided enhancing the yield proportion of good chips.

In the figures, the numbering of the elements illustrated is as follows: n semiconductor substrate 1; n drift region 2; p base region 3; n emitter region 4; gate insulator film 5; gate electrode 6; interlayer insulator film 7; emitter electrode 8; n field stop layer 9; p collector layer 10; first titanium film 11; Al—Si film 12; second titanium film 13; nickel film 14; back surface region diffusion layer 16; back surface electrode 17; front surface region structure 18; back surface region structure 19; chip 20; region for forming a chip 20a; solder 21; support conductor 22; back surface 23, 23a; wafer (n type, after grinding) 30; wafer (n type, before grinding) 30a; wafer (after forming a front surface region structure and a back surface region structure) 31; scribe line 32; stage 35; dust 36; titanium film 51; nickel film 52; back surface electrode 54; back surface region structure 55; chip (after cutting) 60; region for forming a chip 60a; wafer (after forming front and back surface structure) 61; scribe line 62; metal fitting 63; probe 64; and curve tracer 65.

DETAILED DESCRIPTION OF THE INVENTION

Now, a preferred embodiment will be described in the following with reference to the accompanying drawings.

EXAMPLE

Figure 1:
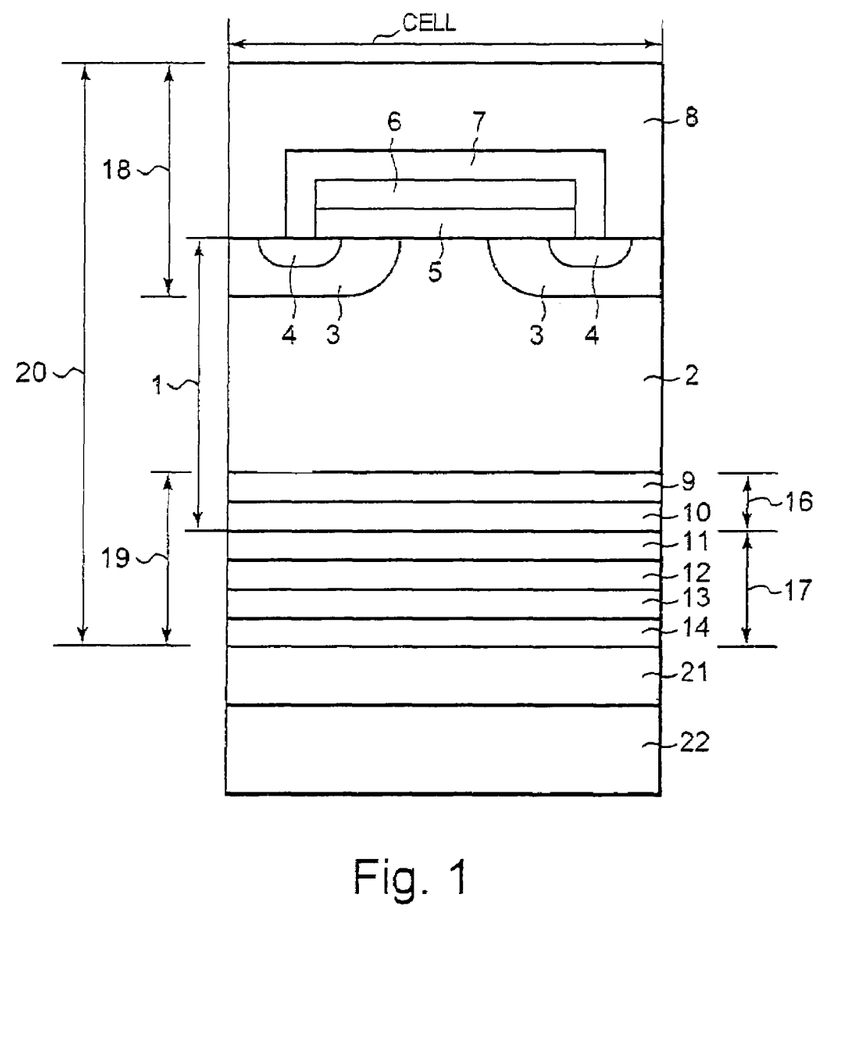
FIG. 1 is a sectional view of an essential part of an embodiment according to the present invention.

FIG. 1 is a sectional view of an essential part of an embodiment according to the present invention. This is a sectional view of a cell related to the FT-IGBT of FIG. 6, and similar parts are given the same symbols as in FIG. 6. Although. FIG. 1 shows a cell of an FS-IGBT of planar gate type, the present invention can also be applied to trench gate type devices.

The FS-IGBT of FIG. 1 is composed of an n drift layer 2, a front surface region structure 18, a back surface region structure 19, and a support conductor 22. The front surface region structure 18 is composed of a p base region 3 formed in the front surface region of an n semiconductor substrate 1, an n emitter region 4 formed in the front surface region of the p base region 3, a gate electrode 6 formed over the p base region located between the n emitter region 4 and the n semiconductor substrate 1 intercalating a gate insulator film 5 between the p base region and the gate electrode 6, an interlayer insulator film 7 formed over the gate electrode 6, an emitter electrode 8 in contact with the n emitter region 4 and the p base region 3, and formed over the interlayer insulator film 7, and a protective film of polyimide film or the like (not illustrated in the figure) covering the outermost surface.

The back surface region structure 19 is composed of a back surface region diffusion layer 16 (i.e., a back surface region semiconductor layer) and a back surface electrode 17. The back surface region diffusion layer 16 comprises an n field stop layer 9 and a p collector layer 10 formed on the surface region of the n field stop layer 9. The back surface electrode 17 comprises the films sequentially laminated on the p collector layer 10 towards an outermost metal film, including a first titanium film 11, an Al—Si film 12, a second titanium film 13, and a nickel film 14. The thicknesses of these films are generally different from each other, although depicted nearly equal in FIG. 1 for simplicity. The back surface electrode 17 is bonded to a support conductor 22 with a solder 21. The back surface region diffusion layer 16 can be a back surface region epitaxial layer.

The thickness of the n field stop layer 9 may be about 1 µm and the thickness of the p collector layer 10 may be about 1 µm as well. Thus, the thickness of the back surface region diffusion layer 16, which consists of the n field stop layer 9 and the p collector layer 10, may be about 2 µm. When the thickness of the back surface region diffusion layer 16 exceeds 5 µm, the piezoelectric effect due to dust decreases to such an insignificant degree that the increase of leakage current is suppressed remarkably. When the thickness of the back surface region diffusion layer 16 increases, the strain decreases and the depletion layer does not reach the strained place generated in the n field stop layer 9. As a result, when the thickness of the back surface region diffusion layer 16 exceeds 5 µm, the rate of false judgment is sufficiently low without an Al—Si film 12.

The Al—Si film 12 is a stress relaxation film that relaxes the stress caused by the dust. The Al—Si film 12 has a thickness in the range of 0.3 µm to 4 µm and contains silicon in an amount of at most 2 wt %. If the silicon content is 0 wt %, the Al—Si film 12 is simply a pure aluminum film, which is, of course, allowable in the invention.

The second titanium film 13 (alternatively a molybdenum film or a tungsten film) is a barrier film for avoiding reaction between the nickel film 14 and the Al—Si film 12 by the heat in the soldering process. A gold film or a silver film is provided on the outermost surface to facilitate soldering on the nickel film 14. The outermost metal film is not illustrated in FIG. 1 because the metal is dissolved in the melted solder 21 and disappeared. In this example, the outermost metal film is a gold film.

Though not illustrated in FIG. 1, in the case of a n channel MOSFET or diode, a back surface region diffusion layer of n drain layer or n cathode layer that becomes in contact with a depletion layer and has an impurity concentration over 1018 cm-3 attains an ohmic contact with the first titanium film 11. Thus, when the impurity concentration is more than about 1019 cm-3, the Al—Si film can be applied omitting the first titanium film 11. In the case of a back surface region diffusion layer of p type as in an FS-IGBT or a p channel MOSFET, for example, when the impurity concentration of the back surface region diffusion layer in contact with the back surface electrode is more than about 1015 cm-3, a stress relaxation layer of Al—Si film 12 can be employed omitting the first titanium film 11.

Figure 2:
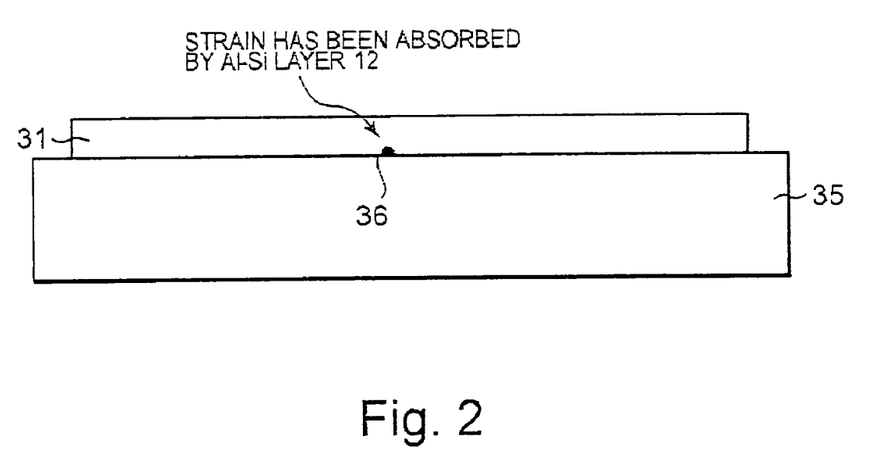
FIG. 2 shows a situation in which the strain due to a dust attached to the stage has been absorbed.
Figure 4:
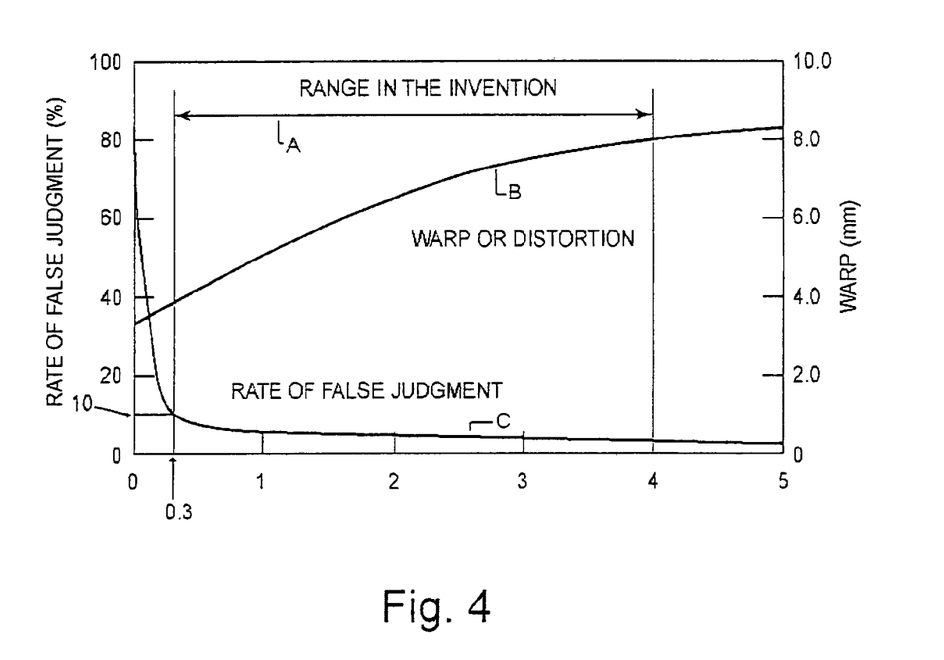
FIG. 4 is a graph showing rate of false judgment of leakage current and distortion of a wafer as functions of thickness of the Al—Si film.

As described above, when a thickness of the back surface region diffusion layer 16 is a thin value of at most 5 µm (over this thickness, the rate of false judgment is sufficiently small without interposing the Al—Si film 12), a stress relaxation film of Al—Si film 12 is intercalated between the first titanium film 11 and the second titanium film 13. In this structure shown in FIG. 2, the Al—Si film 12 absorbs strain due to the dust 36 attached on the stage 35, and the rate of false judgment of leakage current can be reduced. Here, it is effective to set the thickness of the Al—Si film 12 in the range of 0.3 µm to 4 µm. As can be seen in FIG. 4, outside of the Al—Si film thickness range of the invention (indicated by range A), the rate of false judgment (curve C) abruptly increases for a thickness under 0.3 µm, and, at a thickness above 4 µm, a warp or distortion (curve B) of the wafer of more than 8 mm results. It is difficult to transfer such a warped wafer to the next production step.

An Al—Si film 12 having a thickness in the range of 0.3 µm to 4 µm is effective in the case wherein the thickness of the back surface region diffusion layer 10 is not more than 5 µm, diameter of the wafer is at most 8 inches, and thickness of the wafer ranges from about 80 µm to about 140 µm. In addition, the intercalation of the Al—Si film 12 prevents the wafer 31 from cracking or breaking caused by dust 35 and improves the yield proportion of good chips.

Although the invention is explained in the case of an FS-IGBT, the back surface electrode as described in the above embodiment can be applied to a case of a back surface region diffusion layer of an n drain layer having a thickness of not more than 5 µm in a MOSFET using an FZ wafer. In that case, too, the same effect can be obtained as in the above embodiment.

Further, the same effect as in the above embodiment can be obtained when the back surface electrode as described in the above embodiment is applied to a case of a cathode electrode of a diode having a back surface region diffusion layer of n cathode layer with a thickness not more than 5 µm and leakage current is measured with the cathode electrode in contact with the stage for characteristics measurements.

Figure 3A:
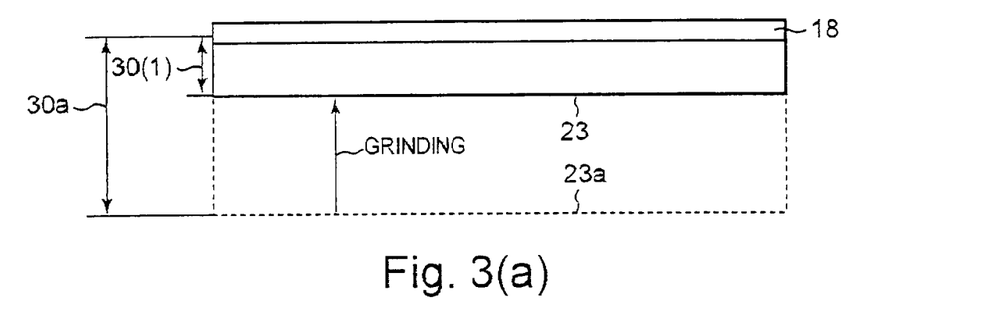
FIGS. 3(a) through 3(c) show a method of manufacturing a semiconductor device and are sectional views illustrating an essential part in the manufacturing process in the sequence of steps in the process.
Figure 3B:
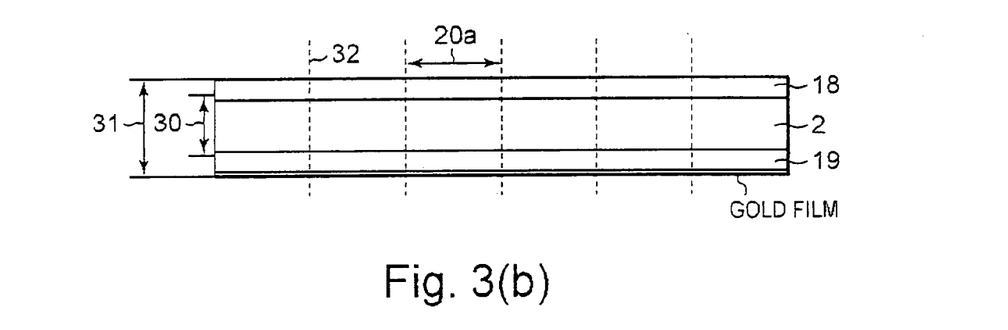
Figure 3C:
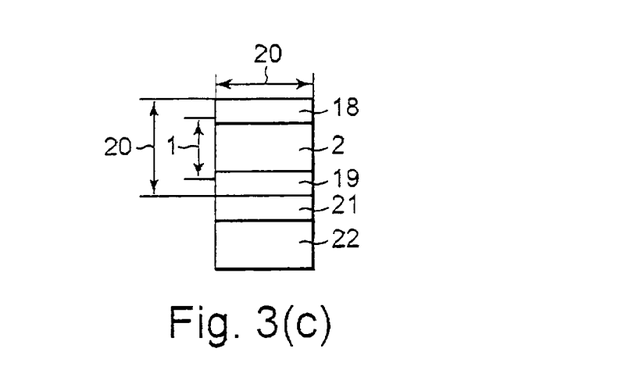

FIGS. 3(a) through 3(c) show a method of manufacturing the semiconductor device of FIG. 1, and are sectional views of essential parts in the manufacturing process illustrated in the sequence of the manufacturing steps. The steps of FIGS. 3(a) through 3(c) are similar to those in FIGS. 7(a) through 7(c) except for the structure of the back surface region structure 19 provided according to this invention which includes a back surface electrode 17 having a stress relaxation layer 12.

Referring to FIG. 3(a), after forming a front surface region structure 18, the back surface 23a of the wafer 30a is ground to make the thickness of the wafer 30, which is being worked into n semiconductor substrate 1, to be 140 µm.

Referring to FIG. 3(b), a back surface region diffusion layer 16 (not illustrated in the figure) is formed on the back surface 23 of the wafer 30. A back surface region structure 19 is formed by laminating a first titanium film 11, an Al—Si film 12, a second titanium film 13 (alternatively, a molybdenum film or a tungsten film), and a nickel film 13 on the surface of a p collector layer 10 of the back surface region diffusion layer 16. A gold film (or a silver film) is formed on the nickel film 13 of the outermost surface of the back surface region structure 19. The gold film facilitates joining the nickel film 14 and the solder 21, and is absorbed by the solder 21 in the joining process and disappears. The Al—Si film 12 contains silicon in an amount of 2 wt %, and the thickness is set at a rather thin value in the range of 0.3 µm to 4 µm. This region 20a forms chip 20 and is the section of the wafer 31 having front surface region structure 18, back surface region structure 19, and a gold film, and is surrounded by the scribe line 32. The gold film is a separate film formed on the back surface region structure 19 and excluded from the back surface region structure 19 in the FIG. 3(b).

Referring to FIG. 3(c), the wafer 31 is cut along the scribe line 32 to form a chip 20 having chip size 20. After that, the gold film on the back surface of the chip 20 is bonded to a support conductor 22 (a copper pattern of an insulated circuit board substrate, for example) with a solder 21. The gold film is absorbed into the solder 21 and disappears after the bonding process as described previously.

FIG. 4 shows the thickness of the Al—Si film 12 and the rate of false judgment of leakage current as functions of distortion of the wafer. The chip size in the wafer, i.e., the size of the region for forming a chip 20a, is 11 mm square and the diameter of the wafer 31 is 6 inches. Measurement of leakage current is carried out in the condition wherein the depletion layer reaches the n field stop layer 9 with application of the rated voltage. The thickness of the back surface region diffusion layer 16 consisting of the n field stop layer 9 and the p collector layer 10 is 2 µm. A similar result has been obtained in the case of a thickness of the back surface region diffusion layer of about 0.1 µm, although not illustrated.

As the thickness of the Al—Si film 12 increases, the rate of false judgment of leakage current decreases and the distortion of the wafer 31 increases. In order to confine the distortion of the wafer within the upper limit of 8 mm that allows transfer of the wafer 31 to the next manufacturing step, the thickness of the Al—Si film 12 is set to be at most 4 µm.

On the other hand, as the thickness of the Al—Si film 12 decreases, the rate of false judgment of leakage current increases. In order to confine the rate of false judgment within 10%, the Al—Si film 12 must have a thickness of at least 0.3 µm. This rate of false judgment is nearly the same in the case of a chip size of 13 mm square.

Therefore, it is preferable that the thickness of the Al—Si film 12 is in the range of 0.3 µm to 4 µm and a silicon content of the Al—Si film 12 is at most 2 wt %. Of course, the stress relaxation film 12 may be composed of a pure aluminum and may be identified as Al film 12.

While the wafer in FIG. 4 has a diameter of 6 inches and a thickness of 140 µm, for a wafer having a diameter of 8 inches and a thickness of 140 µm, a thickness of the Al—Si film 12 that limits the distortion within 8 mm would be thinner than 4 µm. For a wafer having a diameter of 6 inches and a thickness of about 100 µm, the thickness of the Al—Si film 12 that limits the distortion within 8 mm would be 3 µm or less. Thus, the distortion of the wafer 31 can be confined within 8 mm by setting the thickness of the Al—Si film 12 at an appropriate value in the range of 0.3 µm to 4 µm depending on the diameter and thickness of the wafer 31. The rate of false judgment can also be confined within 10%.

While the present invention has been described in conjunction with embodiments and variations thereof, one of ordinary skill, after reviewing the foregoing specification, will be able to effect various changes, substitutions of equivalents and other alterations without departing from the broad concepts disclosed herein. It is therefore intended that Letters Patent granted hereon be limited only by the definition contained in the appended claims and equivalents thereof.

What is claimed is:

1. A semiconductor device, comprising:
   a semiconductor substrate having first and second principal surface regions;
   an insulated gate structure which is formed in the first principal surface region;
   a back surface region semiconductor layer which is formed in the second principal surface region and has a thickness of at most 5 µm;
   an outermost metal film; and
   a back surface electrode which is formed in the second principal surface region between the back surface region semiconductor layer and the outermost metal film and which is composed of a plurality of films which are laminated and include a stress relaxation film.

2. The semiconductor device according to claim 1, wherein the back surface region semiconductor layer is one of a back surface region diffusion layer or a back surface region epitaxial layer.

3. The semiconductor device according to claim 2, wherein the stress relaxation film is a conductive film exhibiting a ductility which is large.

4. The semiconductor device according to claim 3, wherein the conductive film is an Al—Si film containing silicon in an amount of at most 2 wt %.

5. The semiconductor device according to claim 2, wherein the plurality of films which compose the back surface electrode include one of (a) an Al—Si film, a metal barrier film, and a nickel film, or (b) a titanium film, an Al—Si film, a metal barrier film, and a nickel film and are sequentially formed in this order from the back surface region semiconductor layer towards the outermost metal film.

6. The semiconductor device according to claim 5, wherein the metal barrier film is selected from the group consisting of a titanium film, a molybdenum film, and a tungsten film.

7. The semiconductor device according to claim 2, wherein the semiconductor device is an FS-IGBT and the back surface region semiconductor layer is composed of a field stop layer and a collector layer that is formed in contact with the field stop layer.

8. The semiconductor device according to claim 2, wherein the semiconductor is a diode and the back surface region semiconductor layer is a cathode layer.

9. The semiconductor device according to claim 2, wherein the semiconductor is a MOSFET and the back surface region semiconductor layer is a drain layer.

10. The semiconductor device according to claim 2, further comprising a depletion layer which extends in the semiconductor substrate and which reaches the back surface region semiconductor layer at a rated voltage applied between the first principal surface and the second principal surface.

11. The semiconductor device according to claim 1, wherein the stress relaxation film is a conductive film exhibiting a ductility which is large.

12. The semiconductor device according to claim 11, wherein the conductive film is an Al—Si film containing silicon in an amount of at most 2 wt %.

13. The semiconductor device according to claim 1, wherein the plurality of films which compose the back surface electrode include one of (a) an Al—Si film, a metal barrier film, and a nickel film, or (b) a titanium film, an Al—Si film, a metal barrier film, and a nickel film and are sequentially formed in this order from the back surface region semiconductor layer towards the outermost metal film.

14. The semiconductor device according to claim 13, wherein the metal barrier film is selected from the group consisting of a titanium film, a molybdenum film, and a tungsten film.

15. The semiconductor device according to claim 1, wherein the semiconductor device is an FS-IGBT and the back surface region semiconductor layer is composed of a field stop layer and a collector layer that is formed in contact with the field stop layer.

16. The semiconductor device according to claim 1, wherein the semiconductor is a diode and the back surface region semiconductor layer is a cathode layer.

17. The semiconductor device according to claim 1, wherein the semiconductor is a MOSFET and the back surface region semiconductor layer is a drain layer.

18. The semiconductor device according to claim 1, further comprising a depletion layer which extends in the semiconductor substrate and which reaches the back surface region semiconductor layer at a rated voltage applied between the first principal surface and the second principal surface.

19. A semiconductor device, comprising:
an n semiconductor substrate having first and second principal surface regions;
an insulated gate structure formed in the first principal surface region;
a back surface region diffusion layer formed in the second principal surface region, having a thickness of at most 5 μm, and being comprised of:
an n field stop layer formed in the back surface region and having a surface region, and
a p collector layer formed on the surface region of the n field stop layer;
an outermost metal film; and
a back surface electrode formed in the second principal surface region of the semiconductor substrate between the back surface region semiconductor layer and the outermost metal film and composed of a plurality of films which are laminated and which include at least one titanium film, a nickel film, and a stress relaxation film provided so that rate of false judgment of leakage current due to a piezoelectric effect is reduced.

20. The semiconductor device according to claim 19, wherein the stress relaxation film is conductive and ductile, and wherein the stress relaxation film is an Al—Si film having a thickness ranging from about 0.3 μm to about 4 μm.

* * * * *